United States Patent [19]
Yamamoto et al.

[11] Patent Number: 4,754,462
[45] Date of Patent: Jun. 28, 1988

[54] SEMICONDUCTOR LASER DEVICE WITH A V-CHANNEL AND A MESA

[75] Inventors: Saburo Yamamoto, Nara; Taiji Morimato, Nara; Hiroshi Hayashi, Kyoto, all of Japan

[73] Assignee: Sharp Kabushiki Kaisha, Osaka, Japan

[21] Appl. No.: 849,973

[22] Filed: Apr. 10, 1986

[30] Foreign Application Priority Data

Apr. 11, 1985 [JP] Japan .................................. 60-78004

[51] Int. Cl.$^4$ .............................................. H01S 3/19
[52] U.S. Cl. ....................................... 372/45; 372/46; 372/48; 357/17; 357/56
[58] Field of Search ....................... 372/48, 46, 45, 44; 357/17, 56

[56] References Cited

FOREIGN PATENT DOCUMENTS

| 2422287 | 11/1975 | Fed. Rep. of Germany . |
| 56-17093 | 2/1981 | Japan . |
| 56-96890 | 8/1981 | Japan . |
| 56117287 | 7/1984 | Japan . |
| 0005587 | 1/1985 | Japan .................................. 372/46 |
| 60-057988 | 4/1985 | Japan . |

OTHER PUBLICATIONS

*Applied Physics Letters*, vol. 40, No. 5, Mar. 1982, pp. 372-374, by Yamamoto et al., "Visible GaAlAs V-channeled Substrate Inner Stripe Laser with Stabilized Mode Using p–GaAs Substrate".

*Primary Examiner*—James W. Davie
*Attorney, Agent, or Firm*—Armstrong, Nikaido, Marmelstein & Kubovcik

[57] ABSTRACT

A semiconductor laser device comprises an active layer, a current blocking striped-channel formed below the active layer in such a manner that light in the active layer for laser oscillation is absorbed by both shoulders of the striped channel, this results in an index-guided optical waveguide being formed within the active layer. Mesa channels are formed outside of the optical waveguide in a manner to cut off. The active layer, the distance between the mesa-channels is greater than the distance between the shoulders of said striped channel.

6 Claims, 2 Drawing Sheets

SEMICONDUCTOR LASER DEVICE WITH A V-CHANNEL AND A MESA

BACKGROUND OF THE INVENTION

1. Field of the Invention

This invention relates to an index-guided semiconductor laser device which oscillates at a low threshold current.

2. Description of the Prior Art

Conventional semiconductor laser devices are classified into gain-guided semiconductor lasers and index-guided semiconductor lasers. The index-guided semiconductor lasers are advantageous over the gain-guided semiconductor lasers in that they oscillate in a stabilized transverse mode which is important in practical use. BH (buried hetero) lasers and VSIS (V-channeled substrate inner stripe) lasers are typically known as index-guided semiconductor lasers.

FIG. 2(A) shows a BH laser wherein a double-heterostructure is formed in a mesa-fashion on the substrate 1 in a manner to sandwich the active layer 3 for laser oscillation between the cladding layers 2 and 4, and a semiconductor material having a low refractive index is buried in both sides of the mesa-structure, thereby achieving laser oscillation operation based on a complete index-guided action with threshold current of as small as 10 mA or less. However, the BH laser has a disadvantage in that it tends to oscillate in a high-order transverse mode when either of the refractive index of the burying layer 13 made of the low refractive index material or the width w of the waveguide corresponding to the width of the mesa-structure is not selected to be a certain value. Thus, there are many limitations in production conditions. Moreover, the waveguide width w is required to be 2 $\mu$m or less to achieve laser oscillation in a fundamental transverse mode, and accordingly the laser facets tend to be broken down even at a relatively low output power, so that neither the mass production of the devices nor the reliability thereof can be maintained. Reference numeral 5 in FIG. 2(A) is a cap layer for achieving ohmic contact with an electrode thereon.

FIG. 2(B) shows a VSIS laser which is fabricated as follows: On a substrate 1, a current blocking layer 6 is formed, followed by the formation of a V-channel which reaches the substrate 1 to form an electroconductive region, and then a double-heterostructure is formed on the current blocking layer 6 including the V-channel in a manner to sandwich a flat active layer 3 between the cladding layers 2 and 4. The VSIS laser is advantageous in that it does not oscillate in a high-order transverse mode even though the waveguide width w corresponding to the width of the V-channel is set to be great, for example, in the range of 4 to 7 $\mu$m. That is because light outside of the waveguide is absorbed by the substrate 1 so that gain of the high-order mode can be suppressed. However, the threshold current thereof is in the range of 40 to 50 m Å, which is extremely higher than that of the above-mentioned BH laser. That is because carrier injected into the active layer 3 diffuses into both sides of the active layer 3 although current is confined within the inner-striped structure of the current blocking layer 6, and the amount of carriers which are ineffective to laser oscillation increases. FIG. 3 is the carrier distribution showing the carrier density n in the active layer 3 of the VSIS laser in the direction y parallel to the junction. When the waveguide width w is 4 $\mu$m, the carriers in the shaded parts are ineffective carriers which do not contribute to laser oscillation. These ineffective carriers are consumed for emitting unnecessary light and for generating heat, causing an increase in the threshold current and a decrease in the reliability of the laser device.

SUMMARY OF THE INVENTION

The semiconductor laser device of this invention which overcomes the above-discussed and numerous other disadvantages and deficiencies of the prior art, comprises an active layer, a current blocking striped-channel formed below the active layer in such a manner that light in the active layer for laser oscillation is absorbed by both shoulders of the striped channel, resulting in an index-guided optical waveguide within the active layer, mesa-channels are formed outside of the optical waveguide in a manner to cut off the active layer. The distance between the mesa-channels is greater than that between the shoulders of the striped channel.

The mesa-channels are, in a preferred embodiment, void. Alternatively, a burying layer having a greater energy gap than the active layer can be disposed in each of the mesa-channels.

Thus, the invention described herein makes possible the objects of (1) providing a novel semiconductor laser device which gives rise to no high-order mode even though the threshold current is low and the waveguide width is great, for example, in the range of 4 to 7 $\mu$m; (2) providing a novel semiconductor laser device in which since the optical waveguide region is defined by a striped channel, a high-order mode can be suppressed, and moreover since the amount of ineffective carriers which do not contribute to laser oscillation is reduced, the threshold current can be lowered; and (3) a novel semiconductor laser device which can be fabricated by a simple process which is advantageous in practice.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
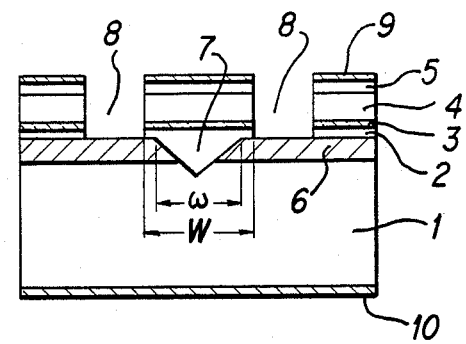
FIG. 1(A) is a cross sectional front view showing a semiconductor laser device of this invention.
FIG. 1(B) is a cross sectional front view showing another semiconductor laser device of this invention.
FIG. 1(C) is a graph showing the carrier density distribution of the semiconductor laser device shown in FIGS. 1(A) and 1(B).
Figure 1:
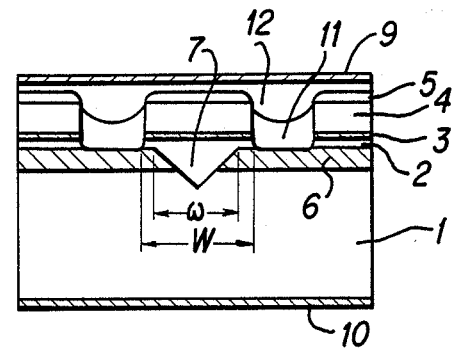
Figure 1:
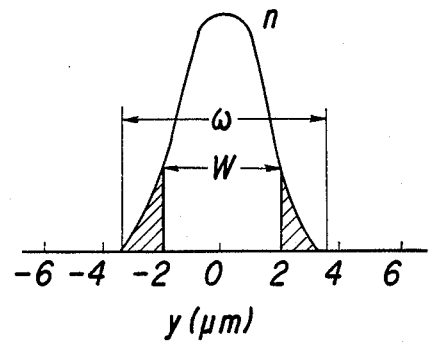
Figure 2A:
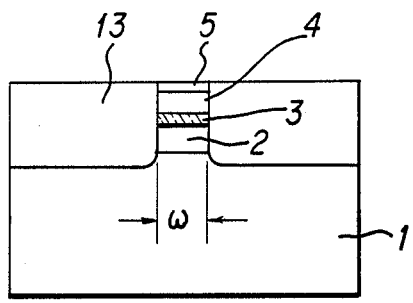
FIG. 2(A) is a cross sectional front view of a conventional BH laser.
Figure 2B:
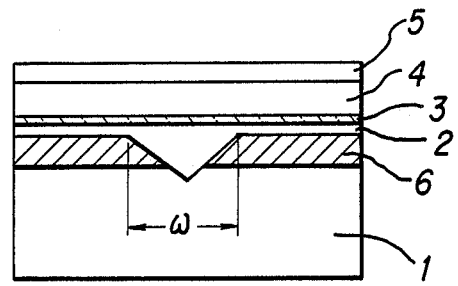
FIG. 2(B) is a cross sectional front view of a conventional VSIS laser.

FIG. 1(A) shows a VSIS semiconductor laser device of this invention which has mesa-channels 8 and 8 ranging from the surface of a cap layer 5 to the active layer 3 outside of the V-channel 7. The width of the V-channel, w, is smaller than that of the mesa-channel, W (i.e., w<W). FIG. 1(B) shows another VSIS semiconductor laser device of this invention wherein a semiconductor crystal 11 with an energy gap which is greater than that of the active layer 3 is buried in the mesa-channels 8 and 8. The crystal 11 is the same material as the cap layer 5.

Figure 3:
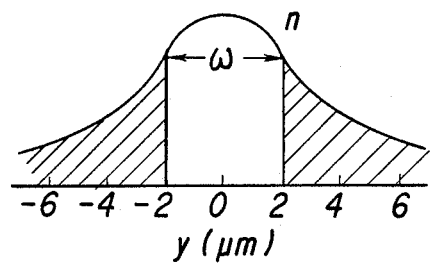
FIG. 3 is a graph showing the carrier density distribution in the VSIS laser.

In VSIS lasers, an index-guided optical waveguide results from the absorption of light from the active layer to the current blocking layer according to their operation principle, and the width of the optical waveguide corresponds to that of the V-channel, w. The diffusion of the carrier in the active layer is prevented by the mesa-channels formed outside of the V-channel and/or the burying layer in each of the mesa-channels, and the carrier density exhibits the distribution shown in FIG. 1(C), indicating that the amount of ineffective carrier in the shaded parts is significantly reduced compared to that in FIG. 3 showing the carrier density distribution of a conventional VSIS semiconductor laser device, resulting in an extremely lowered oscillation threshold current.

EXAMPLE 1

A semiconductor laser device consisting of a GaAs-GaAlAs compound semiconductor is described below according to the production process with reference to FIG. 1(A):

On the (100) face of a p-GaAs substrate 1, an n-GaAs current blocking layer 6 having a thickness of 0.8 μm is grown by an epitaxial growth technique, and then a V-channel 7 having a depth of 1.2 μm and a width w of 4 μm is formed by photolithography and a chemical etching technique in such a manner that it reaches the substrate 1. Then, on the substrate 1 including the V-channel 7, a p-$Ga_{0.7}Al_{0.3}As$ cladding layer 2, a p-$Ga_{0.95}Al_{0.05}As$ active layer 3, an n-$Ga_{0.7}Al_{0.3}As$ cladding layer 4 and an n-GaAs cap layer 5 are successively grown by liquid phase epitaxy, resulting in a double-heterostructure multi-layered crystal for laser oscillation. Then, an Au-Ge metal is evaporated as an n-sided electrode 9 on the surface of the cap layer 5, followed by formation of mesa-channels 8 and 8 outside of the V-channel 7 by photolithography and a reactive ion etching technique in a manner to range from the surface of the n-sided electrode 9 to the n-GaAs current blocking layer 8 and 8, W, is 5.5 μm which is greater than that between the shoulders of the V-channel 7, w, (i.e., the width w of the V-channel 7). The back face of the substrate 1 is then polished to adjust the thickness of the device to approximately 100 μm. On the back face of the substrate 1, an Au-Zn metal is evaporated as a p-sided electrode 10, followed by heating to 450° C. to alloy the n-sided electrode 9 and the p-sided electrode 10 at the same time. The resulting semiconductor laser is cleaved to form a Fabry-Pérot resonator having a cavity length of 250 μm, which is then mounted on a Cu-board by an In metal in such a manner that the face of the n-sided electrode 9 faces the Cu-board, resulting in a desired semiconductor laser device.

The semiconductor laser device obtained by the above-mentioned process oscillates at a wavelength of 820 nm, the threshold current of which is as low as 12 mA. Moreover, it oscillates in a stabilized fundamental transverse mode up to an optical output power of 30 mW or more in CW operation.

EXAMPLE 2

Another semiconductor laser device of this invention is described below with reference to FIG. 1(B):

In the same manner as in Example 1 (FIG. 1(A)), the V-channel 7 and the double-heterostructure multi-layered crystal for laser oscillation are formed on the substrate 1, and the mesa-channels 8 and 8 are formed outside of the V-channel 7, followed by forming a p-$Ga_{0.8}Al_{0.2}As$ burying layer 11 within the mesa-channels 8 and 8 by liquid phase epitaxy to define both sides faces of the active layer 3 by the burying layer 11. Then, a contact layer 12 consisting of the same crystal, n-GaAs, as the cap layer 5 is grown until the surface thereof becomes flat on the cap layer 5 and the burying layer 11. Since the p-$Ga_{0.8}Al_{0.2}As$ burying layer 11 has a greater energy gap than the active layer 3, it can prevent the diffusion of carrier from the active layer 3 thereto. An Au-Ge metal is evaporated as an n-sided electrode 9 on the surface of the contact layer 12 and an Au-Zn metal is evaporated as a p-sided electrode 10 on the back face of the p-GaAs substrate 1, followed by heating to 450° C., resulting in an alloy.

The semiconductor laser device obtained by the above-mentioned process oscillates at a wavelength of 820 nm, the threshold of which is as low as 10 mA. The semiconductor laser device of this example is more excellent in heat radiation than that shown in FIG. 1(A) of Example 1, and accordingly it is especially advantageous for high-output power operation.

The semiconductor laser device of this invention is not limited to the above-mentioned GaAs-GaAlAs compound semiconductor, but is applicable to other heterostructure laser devices such as an InP-InGaAsP semiconductor. The crystal growth technique used in this invention is LPE (liquid phase epitaxy), but it is not limited thereto. MO-CVD (metal organic-chemical vapor deposition), VPE (vapor phase epitaxy), MBE (molecular beam epitaxy), etc., can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser device comprising:
   a substrate;
   a current blocking layer formed on said substrate;
   a striped-channel formed on said current blocking layer and said substrate;
   a multilayer striped-mesa formed on said current blocking layer including said striped-channel;
   a first electrode formed under said substrate; and
   a second electrode formed on said multilayer striped-mesa,
   a width of said multilayer striped-mesa being greater than a distance between shoulders of said striped-channel,
   said multilayer striped-mesa comprising a first cladding layer filling said striped-channel, and an active layer formed on said cladding layer.

2. A semiconductor laser device according to claim 1, wherein each lateral side of said active layer is buried by a burying layer having a greater energy gap than said active layer.

3. A semiconductor laser device according to claim 2, wherein a contact layer is formed over said multilayer striped-mesa and said burying layers.

4. A semiconductor laser device according to claim 1, wherein each lateral side of said multilayer striped-mesa is defined by a mesa-channel.

5. A semiconductor laser device according to claim 4, wherein each of the lateral sides of said active layer is buried by a burying layer having a greater energy gap than said active layer and disposed in one of said mesa-channels.

6. A semiconductor laser device according to claim 5, wherein a contact layer is formed over said multilayer striped-mesa and said burying layers.

* * * * *